United States Patent [19]
Koch et al.

[11] Patent Number: 5,557,187
[45] Date of Patent: Sep. 17, 1996

[54] SWITCHED CAPACITOR NETWORK

[75] Inventors: Rudolf Koch, Oberhaching; Michael Alger-Meunier, Haar, both of Germany

[73] Assignee: Siemens Aktiengesellschaft, Munich, Germany

[21] Appl. No.: 297,618

[22] Filed: Aug. 29, 1994

[30] Foreign Application Priority Data

Aug. 27, 1993 [DE] Germany ............... 43 28 974.6

[51] Int. Cl.$^6$ ............... H03M 1/66; H02M 3/06; G05B 24/02; H02J 1/00
[52] U.S. Cl. ............... 320/1; 347/147; 307/109; 323/351
[58] Field of Search ............... 341/147; 320/1; 307/109, 110; 323/351

[56] References Cited

U.S. PATENT DOCUMENTS 4,999,634  3/1991  Brazdrum et al. ............... 341/172
5,057,839  10/1991  Koch .

FOREIGN PATENT DOCUMENTS 0396786  11/1990  European Pat. Off. .

Primary Examiner—Peter S. Wong
Assistant Examiner—Gregory J. Toatley, Jr.
Attorney, Agent, or Firm—Herbert L. Lerner; Laurence A. Greenberg

[57] ABSTRACT

A switched capacitor network includes a switch device alternatingly charging two first capacitors having the same capacitance from a signal voltage source with polarities being opposite relative to a ground potential and then discharging each of the two first capacitors through the input circuit of a respective differential amplifier. The switch device alternatingly charges two second capacitors having the same capacitance in phase opposition with one another from a reference voltage source with the same polarities relative to the ground potential and then discharges each of the two second capacitors through the input circuit of a respective one of the differential amplifiers, in synchronism with the charging and discharging of the two first capacitors. The switch device charges each of two third capacitors having the same capacitance as the second capacitors in phase opposition with a respective corresponding one of the second capacitors from the reference voltage source with the same polarities relative to the ground potential and then discharges each of the two third capacitors through the input circuit of a respective one of the differential amplifiers.

2 Claims, 2 Drawing Sheets

SWITCHED CAPACITOR NETWORK

BACKGROUND OF THE INVENTION

Field of the Invention

The invention relates to a switched capacitor network having a switch device which charges two first capacitors of the same capacitance alternatingly from a signal voltage source with polarities that are opposite relative to a ground potential and then discharges them each through a respective input circuit of a differential amplifier, and in synchronism therewith it alternatingly charges two second capacitors of the same capacitance and in phase opposition with one another from a reference voltage source with the same polarities relative to the ground potential and then discharges them each through a respective input circuit of the differential amplifier.

Active networks, to be realized, typically require an operational amplifier as an active component and capacitors and resistors as passive elements. The frequency dependency of the network is determined by the capacitors and resistors being used. Conversely, in switched capacitor networks, resistors are simulated by switched capacitors, and there is a linear relationship between the switching frequency and the equivalent electric conductance or guide value, corresponding to an ohmic resistor. The frequency dependency of the network can thus be varied in a simple way by varying the switch frequency.

Typically, the capacitors of a switched capacitor network are switched in such a way that they are each charged in a switching phase and discharged again in an ensuing switching phase. Instead of the discharge, a charge reversal can also ensue, which is equivalent to discharging with subsequent charging having opposite polarity. The onset of the charging or charge reversal process represents a major load for the charging voltage source, since the capacitor briefly forms a short circuit, and the current is primarily limited only by the internal resistance of the voltage source and the contact resistance of the switch device. The consequence is initially a voltage dip at the voltage source and subsequently a transient effect, which is determined essentially by the capacitance of the capacitor, the internal resistance of the voltage source, and the contact resistance of the switch device. That can cause inadequate charging of the respective capacitor in the corresponding switching phase, and resultant disruptions in the entire network.

If a switched capacitor network has an (additional) signal path with a further capacitor, which is coupled to the already existing path and carried to a (differential) amplifier, then the charging of the first capacitor can also be dependent on the signal in the signal path. Such a network is defined, for instance, by a sigma-delta modulator described in Published European Application No. 0 396 786 A1, corresponding to U.S. Pat. No. 4,999,634.

In it, two identical capacitors in the signal path are alternatingly charged from a signal voltage source that is symmetrical relative to a ground potential and then are discharged through corresponding differential inputs of a differential amplifier. A feedback path is coupled to the signal path and essentially includes a digital/analog converter triggered by the output signal of the sigma-delta modulator. The digital/analog converter is likewise differentially constructed and therefore also requires differential reference voltages. However, instead of a bipolar voltage source only a unipolar voltage source is used, and the two capacitors of the digital/analog converter are therefore charged and discharged in phase opposition with one another in the feedback path.

However, it is problematical in that case that the reference voltage source used to charge the capacitors in the feedback path typically includes a closed-loop control circuit, such as a suitably wired operational amplifier. In a first switching phase, only the signal is present at the coupling point of the signal path and the feedback path, and the operational amplifier of a following integrator is decoupled. In that phase, one of the two capacitors in the feedback path is charged, but without major effects on the associated coupling point. In the ensuing second switching phase, the other capacitor in the feedback path is charged, specifically through the input circuit of the following operational amplifier, which is wired as an integrator, to which the capacitors in the signal path are also connected. Consequently, the operational amplifier stabilizes the nodes relative to the ground potential, as a function of the signal. That process is copied to the reference voltage source, through the connector capacitor in the feedback path. As a rule, however, the operational amplifier of the reference voltage path has a substantially narrower bandwidth than the operational amplifier of the integrator, so that the disturbances in the reference voltage source caused by the signal cannot be stabilized.

SUMMARY OF THE INVENTION

It is accordingly an object of the invention to provide a switched capacitor network, which overcomes the hereinafore-mentioned disadvantages of the heretofore-known devices of this general type and in which signal-dependent disturbances of the reference voltage source are suppressed.

With the foregoing and other objects in view there is provided, in accordance with the invention, a switched capacitor network, comprising a signal voltage source; a reference voltage source; differential amplifiers having input circuits; two first capacitors having the same capacitance, two second capacitors having the same capacitance, and two third capacitors having the same capacitance as the second capacitors; a switch device alternatingly charging the two first capacitors from the signal voltage source with polarities being opposite relative to a ground potential and then discharging each of the two first capacitors through the input circuit of a respective one of the differential amplifiers; the switch device alternatingly charging the two second capacitors in phase opposition with one another from the reference voltage source with the same polarities relative to the ground potential and then discharging each of the two second capacitors through the input circuit of a respective one of the differential amplifiers, in synchronism with the charging and discharging of the two first capacitors; and the switch device charging each of the two third capacitors in phase opposition with a respective corresponding one of the second capacitors from the reference voltage source with the same polarities relative to the ground potential and then discharging each of the two third capacitors through the input circuit of a respective one of the differential amplifiers.

In accordance with a concomitant feature of the invention, there are provided two fourth capacitors, which are charged and discharged by means of an additional switch device, in each case in synchronism with one of the two second capacitors and which for charging are switched between the reference voltage source and a further reference voltage source, wherein the product of the capacitance of each second capacitor and the voltage of the first reference voltage source is equal to the product of the capacitance of every fourth capacitor and the voltage difference between the two voltage sources, and the product of the capacitance of every second capacitor and the junction resistance of the switch device in the respective supply line path is equal to the product of the capacitance of every fourth capacitor and the sum of the internal resistance of the further reference voltage source and of the junction resistance of the further switch device in the supply line path of every fourth capacitor.

The signal-independent voltage dip upon connection of the first capacitor by means of the first switch device and the ensuing transient effect are therefore compensated for according to the invention by generating an opposite-polarity but otherwise identical voltage course with the aid of the second voltage source in combination with the second capacitor and the second switch device, which is superimposed on the course of the first voltage source.

Typically, the resistances (or impedances) occurring on the supply lines are negligible as compared with the internal resistance of the voltage sources and the contact resistance of the switch device. Therefore, in general, they have no influence on the function of the network either. Should that not be the case, however, then consequently adaptation of the resistances (impedances) of the supply lines and optionally further resistances (impedances) between the second voltage source and the second capacitor to corresponding resistances (impedances) between the first voltage source and the second capacitor is necessary. Moreover, if alternating voltage sources are used instead of direct voltage sources, care must be taken to ensure that their voltages are in phase with one another. Alternating voltage sources of this kind are realized, for instance, with two amplifiers of different gains, that are triggered by one signal source.

Other features which are considered as characteristic for the invention are set forth in the appended claims.

Although the invention is illustrated and described herein as embodied in a switched capacitor network, it is nevertheless not intended to be limited to the details shown, since various modifications and structural changes may be made therein without departing from the spirit of the invention and within the scope and range of equivalents of the claims.

The construction and method-of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
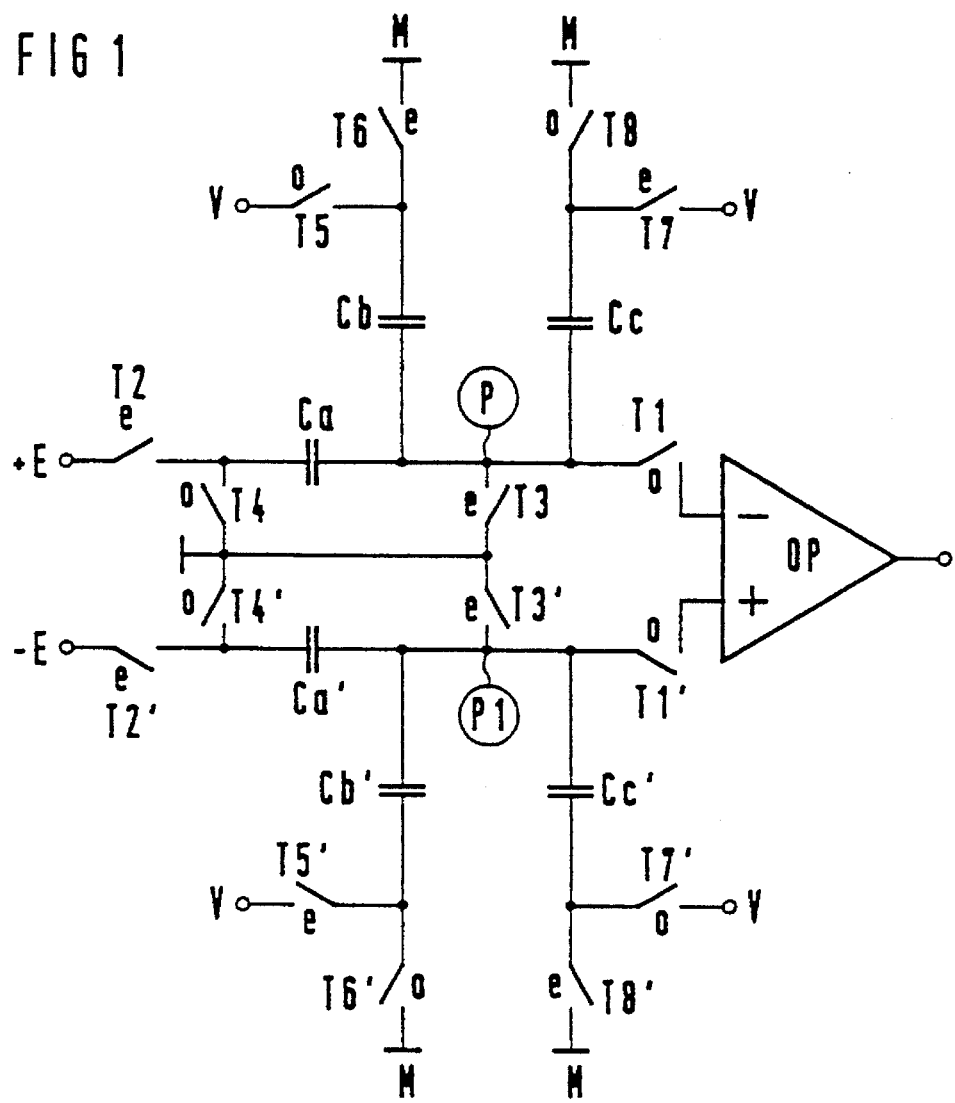
FIG. 1 is a schematic circuit diagram of a general exemplary embodiment of a network according to the invention.

Referring now to the figures of the drawing in detail and first, particularly, to FIG. 1 thereof, there is seen an exemplary embodiment in which the inverting input of an operational amplifier OP is connected through a switch T1, a capacitor Ca and a switch T2 in series with an input terminal, to which a signal +E is applied. Correspondingly, the non-inverting input of the operational amplifier OP is connected through a switch T1', a capacitor Ca' and a switch T2' in series with a further input terminal, to which a signal −E is applied. Each of two terminals of the capacitors Ca and Ca' can be connected through a respective switch T3, T3' and T4, T4' to a ground potential M. The signals +E and −E form a signal that is symmetrical relative to the ground potential M. Capacitors Cb and Cb' each have one terminal which is coupled to a respective node P and P1 that is formed of a terminal of the respective capacitor Ca and Ca' which is closest to the operational amplifier OP and associated terminals of the switches T1, T3 and T1', T3'. Another terminal of each of these capacitors Cb and Cb' can be connected to a reference potential V through a respective switch T5 and T5' and to the ground potential M through a respective switch T6 and T6'.

In order to suppress signal-dependent disturbances at the node P, according to the invention a further capacitor Cc' with the same capacitance as the capacitor Cb' is provided. The further capacitor Cc' is charged and discharged in phase with the capacitor Cb by means of respective switches T7' and T8'. However, in order to assure an identical load on the reference voltage source generating the reference voltage V in the charging phase of the capacitor Cb' as well, during which the operational amplifier OP is decoupled by means of the switches T1 and T1', a capacitor Cc with the same capacitance as the capacitor Cb' is also provided and charged and discharged in phase with it by means of switches T7 and T8. Since the switches T1–T6 are identical to the switches T1'–T6' because of the symmetry of the circuit, and the capacitors Ca and Cb are constructed identically to the capacitors Ca' and Cb' then accordingly the capacitors Cb, Cb', Cc and Cc' on one hand, and the switches T7, T7', T8 and T8', on the other hand are also identical to one another. The switches T2, T2', T3, T3', T5', T6, T8' are controlled by a clock signal e, and the switches T1, T1', T4, T4', T5, T6', T7' and T8 are controlled by a clock signal o.

Figure 2:
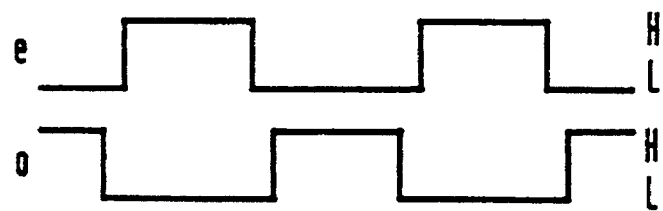
FIG. 2 is a diagram of the course of switching phases in the network of FIG. 1.

The switching phases of all of the switches T2, T2', T3, T3', T5', T6', T6, T8, T8', T1, T1', T4, T4', T5, T6', T7', T8 are equivalent to H levels of the clock signals e and o. The timing relationship of the two phases is shown in FIG. 2 of the drawing. As this figure shows, the generation of signals of opposed phase takes place continuously. First, the clock signal e is at a high level H, and the clock signal o is at a low level L. After a signal change of the clock signal e and after a brief delay time, a signal change of the clock signal o from the low level L to the high level H takes place. After the signal transition from the level H to the level L of the clock signal o, a signal change from the level L to the level H takes place, after a brief delay, for the clock signal e. The clock signal e then carries the level H for a predetermined period of time, until a change again takes place, and so forth.

Figure 3:
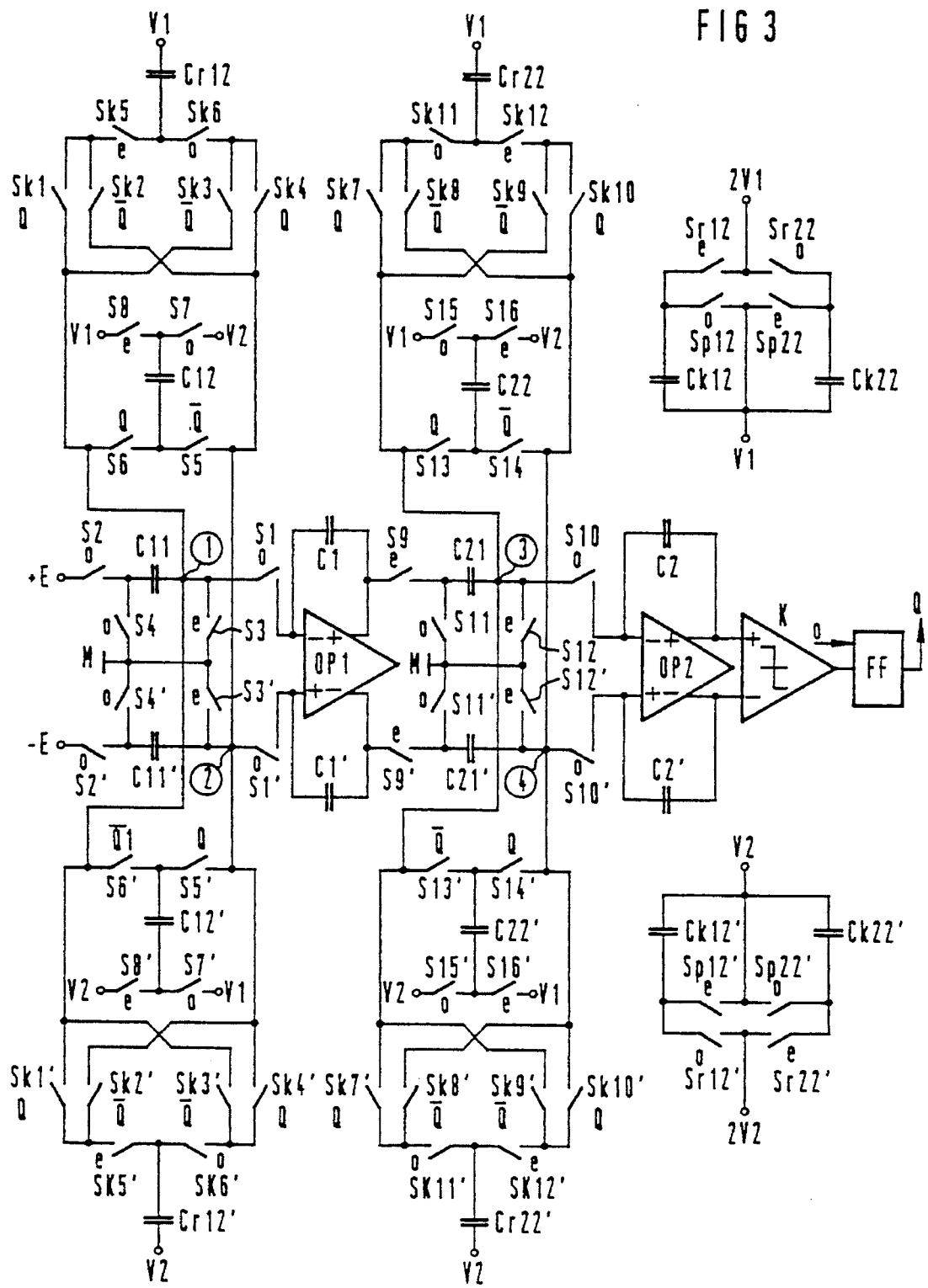
FIG. 3 is a circuit diagram showing an application of the invention in a known sigma-delta modulator.

An application of the invention to a switched-capacitor-type sigma-delta modulator, which is known from Published European Application No. 0 396 786 A1, corresponding to U.S. Pat. No. 4,999,634, will be discussed below. In FIG. 3, two operational amplifiers OP1 and OP2 are provided in the known sigma-delta modulator. In the case of the operational amplifier OP1, a capacitor C1 is connected between a non-inverting output and an inverting input, and a capacitor C1' is connected between an inverting output and a non-inverting input. The inverting input of the operational amplifier OP1 is also connected, through a switch S1, a capacitor C11 and a switch S2, to an input +E, and the non-inverting input of the operational amplifier OP1 is also connected, through a switch S1', a capacitor C11' and a switch S2', to an input −E. Moreover, a terminal of the capacitor C11 facing toward the input +E can be connected to a ground potential M through a switch S4, and a terminal of the capacitor C11 facing away from the input +E can be connected to the ground potential M through a switch S3. Correspondingly, a terminal of the capacitor C11' facing toward the input −E can be connected to a ground potential M through a switch S4', and a terminal of the capacitor C11' facing away from the input −E can be connected to the ground potential M through a switch S3'.

A node 1 formed by the capacitor C11, the switch S3 and the switch S1 is connected firstly through a switch S6 to one terminal of a capacitor C12 and secondly through a switch S6' to one terminal of a capacitor C12'. In the same way, a node 2 formed by the capacitor C11', the switch S3' and the switch S1' is connected firstly through a switch S5 to the one terminal of the capacitor C12 and secondly through a switch S5' to the one terminal of the capacitor C12'. The other terminal of each respective one of the capacitors C12 and C12' is connectable to a potential V1 through respective switches S8 and S7' and to a potential V2 through respective switches S7 and S8'.

In the case of the operational amplifier OP2, a capacitor C2 is connected between the non-inverting output and the inverting input, and a capacitor C2' is connected between the inverting output and the non-inverting input. The non-inverting output of the operational amplifier OP1 is connected through a switch S9, a capacitor C21 and a switch S10, to the inverting input of the operational amplifier OP2. In the same way, the inverting output of the operational amplifier OP1 is connected through a switch S9' a capacitor C21' and a switch S10', to the non-inverting input of the operational amplifier OP2. Moreover, terminals of the two capacitors C21 and C21' facing toward the operational amplifier OP1 can each be connected to the ground potential M through a respective switch S11 and S11', and the terminals of the two capacitors C21 and C21' facing toward the operational amplifier OP2 can each be connected to the ground potential M through a respective switch S12 and S12'.

One terminal of a capacitor C22 is connected through a switch S13, and one terminal of a capacitor C22' is connected through a switch S13', to a node 3 formed by the capacitor C21, the switch S12 and the switch S10. A node 4 formed by the capacitor C21', the switch S12' and the switch S10' is connected through a switch S14 to the one terminal of the capacitor C22 and through a switch S14' to the one terminal of the capacitor C22'. The other terminals of the capacitors C22 and C22' can be connected firstly through a respective switch S15 and S16' to the potential V1 and secondly through a respective switch S15' and S16 to a potential V2.

The non-inverting output of the operational amplifier OP2 is coupled to the non-inverting input of a comparator K, and the inverting output of the operational amplifier OP2 is connected to the inverting input of the comparator K. The output of the comparator K is carried to the input of a flip-flop FF, which is provided as a memory element. An output signal Q is present at the output of the flip-flop FF.

The switches S2, S2', S3, S3', S8, S8', S9, S9', S12, S12', S16, S16' and the comparator K are controlled with the clock signal e. Correspondingly, the switches S1, S1', S4, S4', S7, S7', S11, S11', S10, S10', S15, S15' and the flip-flop FF are operated with the clock signal o. Finally, the switching cycles of the switches S6, S5', S13, S14' are defined by the output signal Q, and the switching cycles of the switches S5, S6', S13', S14 are defined by the inverted output signal $\overline{Q}$. The course of the clock signals e and o can again be found in FIG. 2.

In the sigma-delta modulator shown, the capacitors C11, C11', C21 and C21' are first charged from alternating voltage sources, namely by the symmetrical input signal +E and −E or by the symmetrical output signals of the operational amplifier OP1. Conversely, the capacitors C12, C12', C22 and C22' are charged by reference voltage sources, which generate the constant potentials V1 and V2. In this sigma-delta modulator, signal-correlated capacitive loads of the reference voltage sources, which differ in the various switching phases of the clock signals e and o, lead to undesired interference signals in the signal branch. For instance, during the switching phase of the clock signal e, the capacitor C12 is connected on one hand to the reference potential V1 and on the other hand to the integrator input, which forms the virtual ground potential. Therefore, the reference voltage source that generates the reference potential V1 is loaded, and the integrator with the operational amplifier OP1 and the capacitor C1 is interfered with. Conversely, in the switching phase of the clock signal o, the capacitor C12 is located between the reference potential V1 and the ground potential M and likewise loads the reference potential source that generates the potential V1, but without any effect on the signal +E supplied through the capacitor C11. Corresponding disturbances are brought about in the same way by the capacitors C12', C22 and C22'.

In order to compensate for the signal-dependent loading of the reference sources by the capacitors C12, C12', C22 and C22', one additional capacitor-switch structure is also provided between the node 1 formed by the capacitor C11, the switch S1 and the switch S3, and the potential V1, and another additional capacitor-switch structure is provided between the node 2 formed by the capacitor C11', the switch S1' and the switch S3' and the potential V2. Beginning at the node 1, a switch Sk1 and a switch Sk3 each lead to a respective switch Sk5 and Sk6, which in turn are connected on one hand to one another and on the other hand to one terminal of a capacitor Cr12. The other terminal of the capacitor Cr12 is connected to the potential V1. The node 2 is coupled through switches Sk2 and Sk4 to the respective switches Sk5 and Sk6. The node 1 is also coupleable on one hand through a switch Sk1' to a switch Sk5' and on the other hand through a switch Sk3' to a switch Sk6', and the node 2 can be coupled on one hand through a switch Sk2' to the switch Sk5' and on the other hand through a switch Sk4' to the switch Sk6'. The switches Sk5' and Sk6' lead to one terminal of a capacitor Cr12', having another terminal to which the potential V2 is applied. The capacitors Cr12 and Cr12' correspond in their construction to the capacitors C12 and C12', respectively The switches Sk5 and Sk5' are controlled by the clock signal e, and the switches Sk6 and Sk6' are controlled by the clock signal o. The output signal Q is provided for controlling the switches Sk1, Sk1', Sk4 and Sk4', and the inverted output signal $\overline{Q}$ is provided for triggering the switches Sk2, Sk2', Sk3 and Sk3'.

Accordingly, such switch-capacitor structures are also switched between the node 3 which is formed by the capacitor C21, the switch S10 and the switch S12, and the potential V1, and also between the node 4 which is formed by the capacitor C21', the switch S10' and the switch S12' and the potential V2. Each of these structures has a respective capacitor Cr22 and Cr22', each having one terminal which is applied to a respective one of the potentials V1 and V2, and each having another terminal which is carried to two switches Sk11 and Sk12 on one hand, and Sk11' and Sk12' on the other hand. Each of the switches Sk11 and Sk11' can be coupled to the node 3 through a respective switch Sk7 and Sk7', and to the node 4 through a respective switch Sk8 and Sk8'. Finally, the switches Sk12 and Sk12' can each be connected to the node 3 through a respective switch Sk9 and Sk9', and to the node 4 through a respective switch Sk10 and Sk10'. The switches Sk7, Sk7', Sk10 and Sk10' are controlled by the output signal Q, and the switches Sk8, Sk8', Sk9 and Sk9' are controlled by the inverted output signal $\overline{Q}$. Finally, the switches Sk11 and Sk11' are triggered with the clock signal o, and the switches Sk12 and Sk12' are triggered with the clock signal e. As a consequence of the signal inversion by the integrator having the operational amplifier OP1 and the capacitors C1 and C1', the switches located closest to the capacitors, that is the switches Sk11, Sk12 on one hand and Sk11', Sk12' on the other hand, are triggered by the respectively other clock signal as compared with the corresponding switches Sk7, Sk8 on one hand and Sk7', Sk8' on the other hand. The capacitors C12 and C22 are also constructed identically to the capacitors C12' and C22', respectively.

In order to compensate for the disturbances caused by the dips in the potentials V1 and V2 in the signal-carrying branches, identically constructed capacitors CK12, CK12', CK22 and CK22' that correspond to the capacitors C12, C12', C22 and C22' are provided. One switch Sp12, Sp22' that is controlled by the clock signal o is connected parallel to each respective one of the capacitors Ck12 and Ck22', and one switch Sp12', Sp22 that is controlled by the clock signal e is likewise connected parallel to each respective one of the capacitors Ck12' and Ck22. These switches provide for periodic discharging of the associated capacitors. The capacitor Ck12 is connected on one side to the potential V1 and on the other side, with the interposition of a switch Sr12 controlled by the clock signal e, it is coupled to a potential 2V1. Correspondingly, the capacitor Ck12' is connected on one side to the potential V2 and on the other side it can be coupled to a potential 2V2 through a switch Sr12' controlled by the clock signal o. Accordingly, the capacitors Ck22 and Ck22' are each connected on side to a respective one of the potentials V1 and V2, and they each can be connected on the other side through a respective switch Sr22 and Sr22', that are respectively controlled by the clock signals o and e, to a respective one of the potentials 2V1 and 2V2. The potentials 2V1 and 2V2 each have twice the value of the respective potentials V1 and V2.

Finally, the voltage sources for generating the potentials 2V1 and 2V2 have a negligible internal resistance as compared to the contact resistance of the switches Sr12, Sr12', Sr22 and Sr22', so that for adaptation of the resistors in the various supply line paths, only these contact resistances have to be adapted. Since the identical capacitors C12, C12', C22 and C22' are connected to the respective potentials V1 and V2 by means of three identical switches on one hand, and to the ground potential M on the other hand, these switches Sr12, Sr12', Sr22 and Sr22' accordingly have three times the contact or transition resistance for that purpose, or are composed of three switches identical to them that are connected in series. The use of as many identical components as possible (switches, capacitors, etc.) is particularly valuable in an embodiment in integrated circuitry, since identical sizes can be achieved with substantially greater relative accuracy with respect to one another than different size relationships.

We claim:

1. A switched capacitor network, comprising:

a signal voltage source;

a reference voltage source;

differential amplifiers having input circuits;

two first capacitors having the same capacitance, two second capacitors having the same capacitance, and two third capacitors having the same capacitance as said second capacitors;

a switch device alternatingly charging said two first capacitors from said signal voltage source with polarities being opposite relative to a ground potential and then discharging each of said two first capacitors through said input circuit of a respective one of said differential amplifiers;

said switch device alternatingly charging said two second capacitors in phase opposition with one another from said reference voltage source with the same polarities relative to the ground potential and then discharging each of said two second capacitors through said input circuit of a respective one of said differential amplifiers, in synchronism with the charging and discharging of said two first capacitors; and said switch device charging each of said two third capacitors in phase opposition with a respective corresponding one of said second capacitors from said reference voltage source with the same polarities relative to the ground potential and then discharging each of said two third capacitors through said input circuit of a respective one of said differential amplifiers.

2. The switched capacitor network according to claim 1, including:

two fourth capacitors;

a further reference voltage source; and an additional switch device charging and discharging each of said two fourth capacitors in synchronism with one of said two second capacitors;

said two fourth capacitors being switched between said reference voltage source and said further reference voltage source for charging;

a product of the capacitance of each of said second capacitors and the voltage of said first reference voltage source being equal to a product of the capacitance of each of said fourth capacitors and a voltage difference between said two voltage sources; and a product of the capacitance of each of said second capacitors and a junction resistance of said switch device in a respective supply line path being equal to a product of the capacitance of each of said fourth capacitors and a sum of the internal resistance of said further reference voltage source and of the junction resistance of said additional switch device in a supply line path of each of said fourth capacitors.

* * * * *